US012692596B2

(12) United States Patent
Wu et al.

(10) Patent No.: US 12,692,596 B2
(45) Date of Patent: Jul. 28, 2026

(54) COVER RING AND GROUND SHIELD FOR PHYSICAL VAPOR DEPOSITION CHAMBER

(71) Applicant: TAIWAN SEMICONDUCTOR MANUFACTURING CO., LTD., Hsinchu (TW)

(72) Inventors: Tsung-Cheng Wu, Hsinchu (TW); Sheng-Ying Wu, Hsinchu (TW); Ming-Hsien Lin, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 912 days.

(21) Appl. No.: 17/119,436

(22) Filed: Dec. 11, 2020

(65) Prior Publication Data

US 2021/0238741 A1 Aug. 5, 2021

Related U.S. Application Data

(60) Provisional application No. 62/968,375, filed on Jan. 31, 2020.

(51) Int. Cl.
*C23C 16/458* (2006.01)
*C23C 16/455* (2006.01)
*H01J 37/32* (2006.01)

(52) U.S. Cl.
CPC .... *C23C 16/45536* (2013.01); *C23C 16/4585* (2013.01); *H01J 37/32082* (2013.01); *H01J 37/32449* (2013.01); *H01J 37/32651* (2013.01)

(58) Field of Classification Search
CPC ........... C23C 16/45536; C23C 16/4585; H01J 37/32082; H01J 37/32449; H01J 37/32651

USPC ......................................................... 118/728
See application file for complete search history.

(56) References Cited

U.S. PATENT DOCUMENTS

| | | | | |
|---|---|---|---|---|
| 4,037,749 A | * | 7/1977 | Reznicek | H01L 23/045 |
| | | | | 257/E23.184 |
| 6,284,986 B1 | | 9/2001 | Dietze et al. | |
| 6,623,597 B1 | * | 9/2003 | Han | H01L 21/67069 |
| | | | | 118/728 |
| 2004/0206804 A1 | * | 10/2004 | Kim | C23C 14/564 |
| | | | | 228/199 |
| 2004/0209554 A1 | | 10/2004 | Tsumagari et al. | |
| 2007/0046927 A1 | | 3/2007 | Le et al. | |
| 2007/0173059 A1 | * | 7/2007 | Young | H01J 37/3426 |
| | | | | 438/648 |
| 2008/0196661 A1 | * | 8/2008 | West | H01J 37/34 |
| | | | | 118/500 |

(Continued)

FOREIGN PATENT DOCUMENTS

| | | |
|---|---|---|
| CN | 1925107 A | 3/2007 |
| CN | 101061253 A | 10/2007 |

(Continued)

*Primary Examiner* — Charlee J. C. Bennett
(74) *Attorney, Agent, or Firm* — STUDEBAKER BRACKETT PLLC

(57) ABSTRACT

An assembly includes a cover ring having a first surface and a second surface opposite the first surface, the first surface of the cover ring having a first roughness, and a deposition ring having a first surface facing the cover ring and a second surface opposite the first surface, the first surface of the deposition ring having a second roughness. The first roughness is different from the second roughness.

20 Claims, 8 Drawing Sheets

(56) References Cited

U.S. PATENT DOCUMENTS

| | | | | |
|---|---|---|---|---|
| 2009/0050272 A1* | 2/2009 | Rosenberg | C23C 16/4581 | |
| | | | 118/728 | |
| 2011/0015773 A1 | 1/2011 | Wilby | | |
| 2013/0026693 A1* | 1/2013 | Ranish | H10P 72/7616 | |
| | | | 269/305 | |
| 2013/0168020 A1* | 7/2013 | Hashiguchi | H01J 37/32642 | |
| | | | 156/345.51 | |
| 2013/0206070 A1 | 8/2013 | Chen | | |
| 2013/0264035 A1 | 10/2013 | Goel et al. | | |
| 2014/0034242 A1* | 2/2014 | Sant | H01J 37/32605 | |
| | | | 29/458 | |
| 2015/0024155 A1* | 1/2015 | Sun | H01J 37/32642 | |
| | | | 427/596 | |
| 2017/0029941 A1 | 2/2017 | Allen et al. | | |
| 2017/0345688 A1 | 11/2017 | Lee et al. | | |

FOREIGN PATENT DOCUMENTS

| | | |
|---|---|---|
| CN | 102506773 A | 6/2012 |
| CN | 203177833 U | 9/2013 |
| JP | 2014008538 A | 1/2014 |

* cited by examiner

COVER RING AND GROUND SHIELD FOR PHYSICAL VAPOR DEPOSITION CHAMBER

CROSS-REFERENCE TO RELATED APPLICATION

This non-provisional application claims priority to U.S. Provisional Patent Application 62/968,375, filed Jan. 31, 2020, the entire disclosure of which is incorporated herein by reference.

BACKGROUND

Physical vapor deposition (PVD), or sputtering, is a process used in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 is a top plan view of the deposition ring shown in FIG. 1.

DETAILED DESCRIPTION

Figure 1:
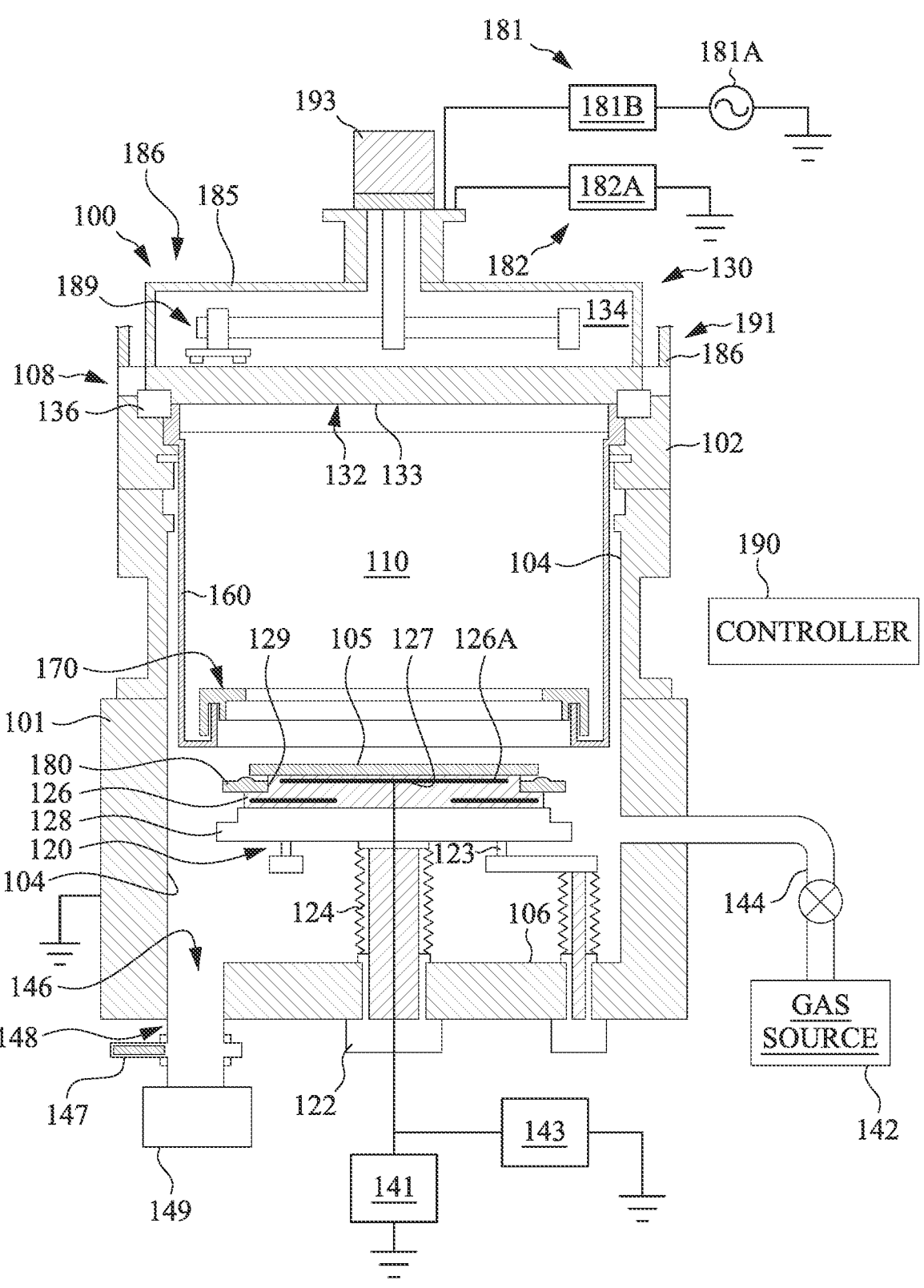
FIG. 1 illustrates a semiconductor processing chamber including a ground shield and a cover ring.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments of the disclosure generally provide a processing chamber and a substrate processing method for performing a physical vapor deposition (PVD) process. The processing chamber is a vacuum chamber that includes an electrostatic chuck (ESC) to support and retain substrates on which the atoms ejected by bombardment of the target material are deposited during PVD processing. The electrostatic chuck includes a ceramic puck having one or more electrodes therein. A chucking voltage is applied to the electrodes to electrostatically hold the substrate to the ESC. The PVD process may cause re-deposition, and the amount of the re-deposition material (e.g., AlO) may be more on the rough surface of the deposition ring than on the smooth surface of the cover ring. The substrate processing method and the processing chamber including a cover ring and a deposition ring, according to embodiments disclosed herein, limits the removal or flaking (peeling) of the deposition material that has accumulated on the deposition ring, and thereby limits the dispersion of the deposition material in the processing chamber.

A cover ring, a deposition ring, and a ground shield are disposed in the vacuum chamber to define a processing region within the vacuum chamber with respect to the substrate. The ground shield interleaves with the cover ring to confine the plasma. Confining the plasma and the ejected atoms to the processing region limits deposition of target material on other components in the chamber and promotes more efficient use of target materials, as a relatively higher percentage of the ejected atoms are deposited on the substrate.

The electrostatic chuck (ESC) supports the deposition ring and is coupled to the bottom of the vacuum chamber by a lift mechanism that is configured to move the electrostatic chuck (ESC) and the deposition ring between an upper and lower position. During operation, the cover ring is also raised and lowered. When raised, the cover ring vertically separates from the ground shield. When lowered, portions of the cover ring are received within portions of the ground shield.

The cover ring and the ground shield are vertically separated from each other when the electrostatic chuck is in the raised position. During processing operations, deposition material from the target is also deposited on the cover ring and the deposition ring. The surfaces of the cover ring and the deposition ring have a rough or uneven finish, e.g., a sandblasted surface. The increased roughness of the surface causes the deposition material to be attached to the deposition ring with relative ease. As the deposition material accumulates on the deposition ring, the cover ring contacts the deposition material. Because the surface of the cover ring is also rough, contact between the cover ring and the deposition material causes the deposition material to flake or peel off with relative ease. These dislodged particles contaminate the substrate and the processing chamber in general. When this happens, operations need to be stopped, and the vacuum chamber is opened and cleaned before further processing can continue.

Embodiments of the disclosure are directed to a cover ring having a bottom surface having a relatively smooth finish such that contact between the bottom surface of the cover ring and the deposition material minimizes dislodging of the deposition material accumulated on the deposition ring. Additionally, or alternatively, in other embodiments of the disclosure, the top surface of the deposition ring has a relatively smooth finish so that deposition material is not easily attached to the deposition ring and accumulation of the deposition material is reduced. In some embodiments, the top surface of the deposition ring and the bottom surface of the cover ring both have a relatively smooth finish that limits adhesion and thereby the accumulation of deposition material and limits the dislodging of deposition material that has accumulated on the deposition ring. According to embodiments of the disclosure, the bottom surface of the cover ring and/or the top surface of the deposition ring are metal that has a relatively smooth, even finish relative to a sandblasted surface.

FIG. 1 illustrates a semiconductor processing chamber 100 including a one-piece ground shield 160 and an interleaving cover ring 170. The ground shield 160 and the interleaving cover ring 170 comprise a process kit that also includes a deposition ring 180 supported on a pedestal assembly 120, configured to process a substrate 105 disposed in a processing region 110 or plasma zone. In some embodiments, the processing chamber 100 includes a sputtering chamber, also called a physical vapor deposition or PVD chamber, used for depositing a single or multi-compositional material from a target 132 on the substrate 105. The processing chamber 100 may also be used to deposit aluminum, copper, nickel, platinum, hafnium, silver, chrome, gold, molybdenum, silicon, ruthenium, tantalum, tantalum nitride, tantalum carbide, titanium nitride, tungsten, tungsten nitride, lanthanum, alumina, lanthanum oxides, nickel platinum alloys, and titanium, and or combination thereof. It is contemplated that other processing chambers may also be adapted to benefit from the disclosed embodiments. The deposition ring 180 has an annular shape surrounding a substrate support 126 and is fabricated from a ceramic or metal material, such as quartz, aluminum oxide, stainless steel, titanium or other suitable material. The cover ring 170 is fabricated from a material that is resistant to erosion by the sputtering plasma, for example, a metallic material, or a ceramic material.

The processing chamber 100 includes a chamber body 101 having sidewalls 104, a bottom wall 106, and an upper process assembly 108 that enclose the processing region 110. The processing region 110 is defined as the region above the substrate support 126 during processing (for example, between the target 132 and the substrate support 126 when in a processing position). The chamber body 101 is fabricated by machining and welding plates of stainless steel or by machining a single mass of aluminum. In one embodiment, the sidewalls 104 include or are plated with aluminum and the bottom wall 106 includes or is plated with stainless steel. The sidewalls 104 generally contain a slit valve to provide for entry and egress of a substrate 105 from the processing chamber 100. Components in the upper process assembly 108 of the processing chamber 100 in cooperation with the grounded shield 160, pedestal assembly 120 and cover ring 170 confine the plasma formed in the processing region 110 to the region above the substrate 105.

The pedestal assembly 120 is supported from the bottom wall 106 of the chamber 100. The pedestal assembly 120 supports the deposition ring 180 along with the substrate 105 during processing. The pedestal assembly 120 is coupled to the bottom wall 106 of the chamber 100 by a lift mechanism 122 that is configured to raise and lower the pedestal assembly 120 between an upper processing position during deposition of target material on the substrate 105 and a lower transfer position where the substrate 105 is transferred onto the pedestal assembly 120. Additionally, in the lower transfer position, lift pins 123 are moved through the pedestal assembly 120 to space the substrate 105 from the pedestal assembly 120 to facilitate exchange of the substrate 105 with a substrate transfer mechanism disposed exterior to the processing chamber 100, such as a single blade robot. A bellows 124 is typically disposed between the pedestal assembly 120 and the bottom wall 106 to isolate the processing region 110 of the chamber body 101 from the interior of the pedestal assembly 120 and the exterior of the chamber.

The pedestal assembly 120 includes a substrate support 126 sealingly coupled to a platform housing 128. The platform housing 128 is typically fabricated from a metallic material such as stainless steel or aluminum. A cooling plate is generally disposed within the platform housing 128 to thermally regulate the support 126. The substrate support 126 is made of aluminum or ceramic. The substrate support 126 has a substrate receiving surface 127 that receives and supports the substrate 105 during processing, the substrate receiving surface 127 being substantially parallel to a sputtering surface 133 of the target 132. The substrate support 126 also has a peripheral edge 129 that terminates before an overhanging edge of the substrate 105. The peripheral edge 129 of the substrate support 126 has a diameter between about 275 mm to about 300 mm. The substrate support 126 has a height greater than about 0.25 inches (about 0.64 centimeter), such as between about 0.30 to about 0.75 inches (about 0.76 to about 1.91 centimeter). The height of the substrate support 126 beneficially spaces the substrate 105 vertically from the horizontal surfaces of the deposition ring 180.

In some embodiments, the substrate support 126 is an electrostatic chuck, a ceramic body, a heater, or a combination thereof. In one embodiment, the substrate support 126 is an electrostatic chuck that includes a dielectric body having electrodes 126A or conductive layer embedded therein. The dielectric body is fabricated from a high thermal conductivity dielectric material such as pyrolytic boron nitride, aluminum nitride, silicon nitride, alumina or an equivalent material. In some embodiments, the electrodes 126A is configured so that when a DC voltage is applied to the electrodes 126A, by an electrostatic chuck power supply 143, a substrate 105 disposed on the substrate receiving surface 127 will be electrostatically chucked thereto to improve the heat transfer between the substrate 105 and the support 126. In other embodiments, an impedance controller 141 is also coupled to the conductive layer 126A so that a voltage can be maintained on the substrate during processing to affect the plasma interaction with the surface of the substrate 105.

In some embodiments, the platform housing 128 includes a material having thermal properties that are suitably matched to the overlying substrate support 126. For example, the platform housing 128 includes a composite of ceramic and metal, such as aluminum silicon carbide, which provides improved strength and durability than ceramic and also has improved heat transfer properties. The composite material has a thermal expansion coefficient that is matched to the material of the substrate support 126 to reduce thermal expansion mismatch. In some embodiments, the composite material includes a ceramic having pores that are infiltrated with a metal, which at least partially fills the pores to form a composite material. The ceramic includes, for example, at least one of silicon carbide, aluminum nitride, aluminum oxide or cordierite. The ceramic comprises a pore volume of from about 20 to about 80 volume % of the total volume, the remainder volume being of the infiltrated metal. The infiltrated metal includes aluminum with added silicon and also contains copper. In some embodiments, the composite includes a different composition of a ceramic and metal, such as metal having dispersed ceramic particles, or the platform housing 128can be made from only a metal, such as stainless steel or aluminum. A cooling plate is disposed within the platform housing 128 to thermally regulate the substrate support 126.

The chamber 100 is controlled by a system controller 190 that facilitates the control and automation of the processing chamber 100 and typically includes a central processing unit (CPU), memory, and support circuits (or I/O). The CPU may be one of any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits include cache, power supplies, clock circuits, input/output circuitry, subsystems, and the like. A program (or computer instructions) readable by the system controller 190 determines which tasks to be performed on the substrate. The program is software readable by the system controller 190 that includes code to perform tasks relating to monitoring, execution and control of the movement and various process recipe tasks and recipe steps being performed in the processing chamber 100. For example, the controller 190 comprises program code that includes a substrate positioning instruction set to operate the pedestal assembly 120, a gas flow control instruction set to operate gas flow control valves to set a flow of sputtering gas to the processing chamber 100, a gas pressure control instruction set to operate a throttle valve or gate valve to maintain a pressure in the processing chamber 100, a temperature control instruction set to control a temperature control system in the pedestal assembly 120 or sidewalls 104 to set temperatures of the substrate or sidewalls 104, respectively, and a process monitoring instruction set to monitor the process in the processing chamber 100.

The upper process assembly 108 includes an RF source 181, a direct current (DC) source 182, an adaptor 102, a motor 193, and a lid assembly 130. The lid assembly 130 includes the target 132, a magnetron system 189 and a lid enclosure 191. The upper process assembly 108 is supported by the sidewalls 104 when in a closed position, as shown in FIG. 1A. A ceramic target isolator 136 is disposed between the target 132 and adaptor 102 of the lid assembly 130 to limit vacuum leakage therebetween. The adaptor 102 is sealably coupled to the sidewalls 104, and is configured to help with the removal of the upper process assembly 108.

The target 132 is disposed adjacent to the adaptor and is exposed to the processing region 110 of the processing chamber 100. The target 132 provides material which is deposited on the substrate during a PVD process.

During processing, the target 132 is biased with RF and/or DC power relative to the ground, e.g. the chamber body 101, by a power source 140 disposed in the RF source 181 and/or the direct current (DC) source 182. In one embodiment, the RF source 181 includes an RF power source 181A and an RF match 181B that are configured to efficiently deliver RF energy to the target 132. In one example, the RF power source 181A generates RF currents at a frequency of between about 13.56 MHz and about 128 MHz at powers between about 0 and about 5 kWatts. In one example, the DC power supply 182A in the DC source 182 delivers between about 0 and about 10 kWatts of DC power. In another example, the RF power source 181A generates an RF power density of between about 0 and about 33 kWatts/m$^2$ at the target and the DC source 182 delivers a power density of between about 0 and about 66 kWatts/m$^2$.

During processing, a gas, such as argon, is supplied to the processing region 110 from a gas source 142 via conduits 144. The gas source 142 includes a non-reactive gas such as argon or xenon, which is capable of energetically impinging upon and sputtering material from the target 132. The gas source 142 also includes a reactive gas, such as one or more of an oxygen-containing gas, a nitrogen-containing gas, a methane-containing gas, that reacts with the sputtering material to form a layer on a substrate. Spent process gas and byproducts are exhausted from the chamber 100 through exhaust ports 146 that receive spent process gas and direct the spent process gas to an exhaust conduit 148 having an adjustable position gate valve 147 to control the pressure in the processing region 110 in the chamber 100. The exhaust conduit 148 is connected to one or more exhaust pumps 149. Typically, the pressure of the sputtering gas in the chamber 100 is set to sub-atmospheric levels, such as a vacuum environment, for example, a pressure of about 0.6 m Torr to about 400 mTorr. A plasma is formed from the gas between the substrate 105 and the target 132. Ions within the plasma are accelerated toward the target 132 and cause material to become dislodged from the target 132. The dislodged target material is deposited on the substrate 105.

The lid enclosure 191 includes a conductive wall 185, a center feed 184 and shielding 186. In this configuration, the conductive wall 185, the center feed 184, the target 132 and a portion of the motor 193 enclose and form a back region 134. The back region 134 is a sealed region disposed on the back side of the target 132 and is generally filled with a flowing liquid during processing to remove the heat generated at the target 132 during processing. In one embodiment, the conductive wall 185 and center feed 184 are configured to support the motor 193 and a magnetron system 189, so that the motor 193 can rotate the magnetron system 189 during processing. In some embodiments, the motor 193 is electrically isolated from the RF or DC power delivered from the power supplies. The shielding 186 includes one or more dielectric materials that are positioned to enclose and limit the RF energy delivered to the target 132 from interfering with and affecting other processing chambers disposed in the cluster tool 103.

The ground shield 160 is supported by the chamber body 101 and encircles the sputtering surface 133 of a sputtering target 132 that faces the substrate support 126. The ground shield 160 also surrounds the peripheral edge 129 of the substrate support 126. The ground shield 160 covers the sidewalls 104 of the chamber 100 to reduce deposition of sputtering deposits originating from the sputtering surface 133 of the sputtering target 132 onto the components and surfaces behind the ground shield 160.

The cover ring 170 rests on the ground shield 160 when the substrate support 126 is in the lower, loading position (illustrated in FIG. 1). When the substrate support 126 is in the upper (raised), deposition position, the cover ring 170 is in close proximity to the deposition ring 180 and separated therefrom. In the deposition position, the cover ring 170 protects the substrate support 126 from sputter deposition.

Figure 2:
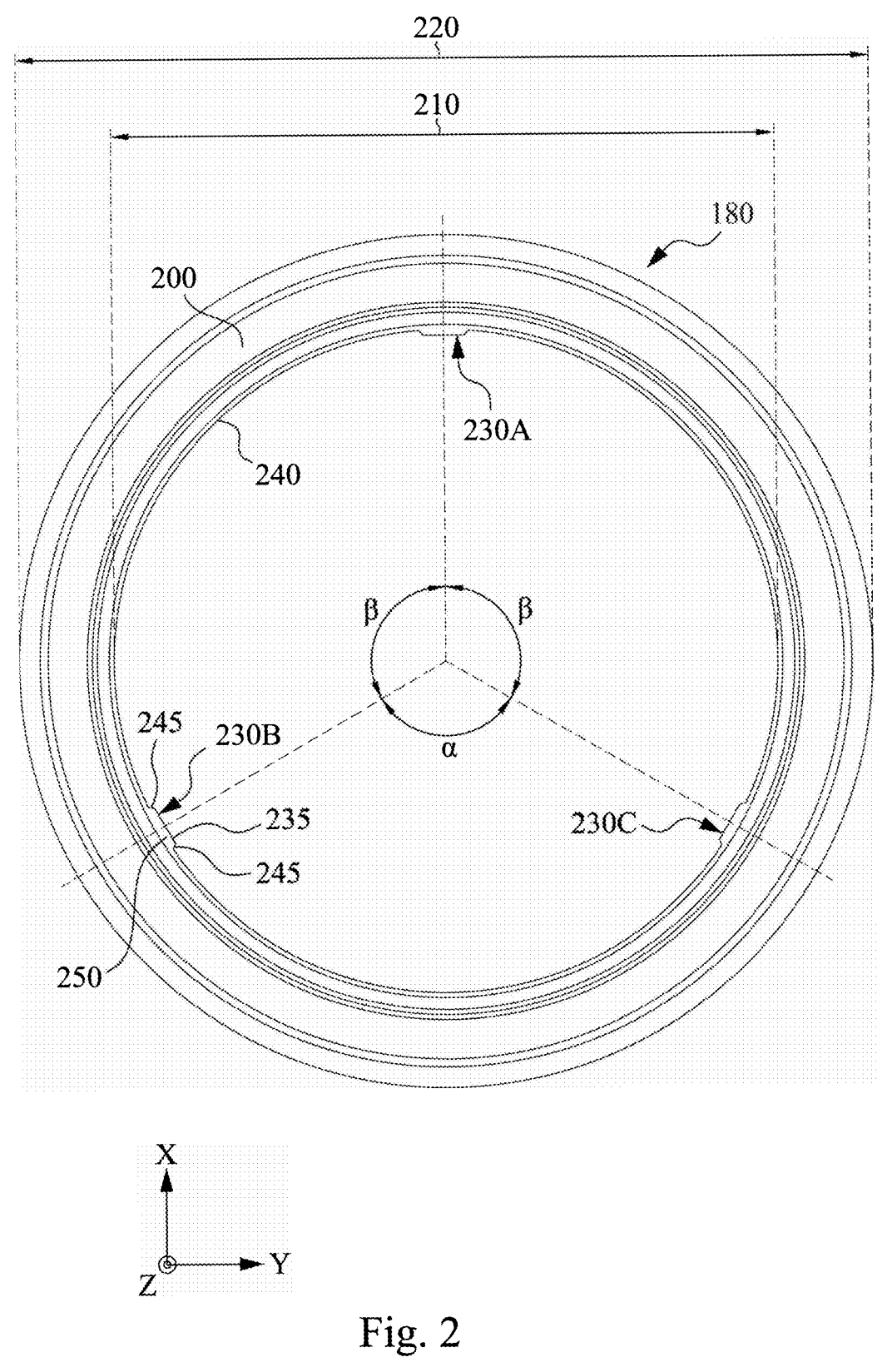

FIG. 2 is a top plan view of the deposition ring 180 shown in FIG. 1. The deposition ring 180 includes a body 200 that is annular or ring-shaped. The body 200 may be made of a ceramic material, such as aluminum oxide ($Al_2O_3$), and formed by a sintering process. The body 200 includes an inner diameter 210 and an outer diameter 220. The inner diameter 210 is less than (e.g., by 1-5 mm) a diameter of a substrate 105 and the outer diameter 220 is greater than or equal to an outer dimension of the substrate support 126.

The body 200 includes one or more extensions 230A, 230B and 230C. The extensions 230A-230C are configured as orientation features that extend radially inward from the inner diameter 210 of the body 200. In one embodiment, the extensions 230A-230C are configured to engage with mating orientation features, such as depressions or other structures disposed on the substrate support 126. The extensions 230A-230C seat the body 200 of the deposition ring 180 in a specific orientation with respect to the substrate support 126. This allows the deposition ring 180 to be removed from the substrate support 126 for cleaning or replacement, and installation on the substrate support 126 while assuring proper alignment between the deposition ring 180 and the substrate support 126. Each of the extensions 230A-230C includes a circumferential face 235 that extends radially inward from an inner peripheral surface 240 of the body 200. The circumferential face 235 interfaces with the body 200 by a transition surface 245 on each side of the circumferential face 235. The transition surfaces 245 may be a sharp corner or a contoured surface, such as a beveled, rounded or tapered surface. Each of the extensions 230A-230C may also include an upper surface 250 that is coplanar with the body 200 of the deposition ring 180. The upper surface 250 substantially planar and the circumferential face 235 extends downwardly (in the Z direction) at about 90 degrees from the plane of the upper surface 250. The circumferential face 235 is rounded and includes a radius between the transition surfaces 245. Alternatively, the circumferential face 235 is flat or planar between the transition surfaces 245.

In some embodiments, each of the extensions 230A-230C are placed at equal angular intervals along the body 200 (e.g., about 120 degrees). In other embodiments, the extensions 230A-230C are placed at irregular angularly intervals spacing. For example, an angle α may be about 90 degrees to about 100 degrees, while the angle β may be about 130 degrees to about 135 degrees. The extensions 230A-2300 are utilized as indexing features to ensure the deposition ring 180 is seated in a specific orientation with respect to the substrate support 126.

Figure 3:
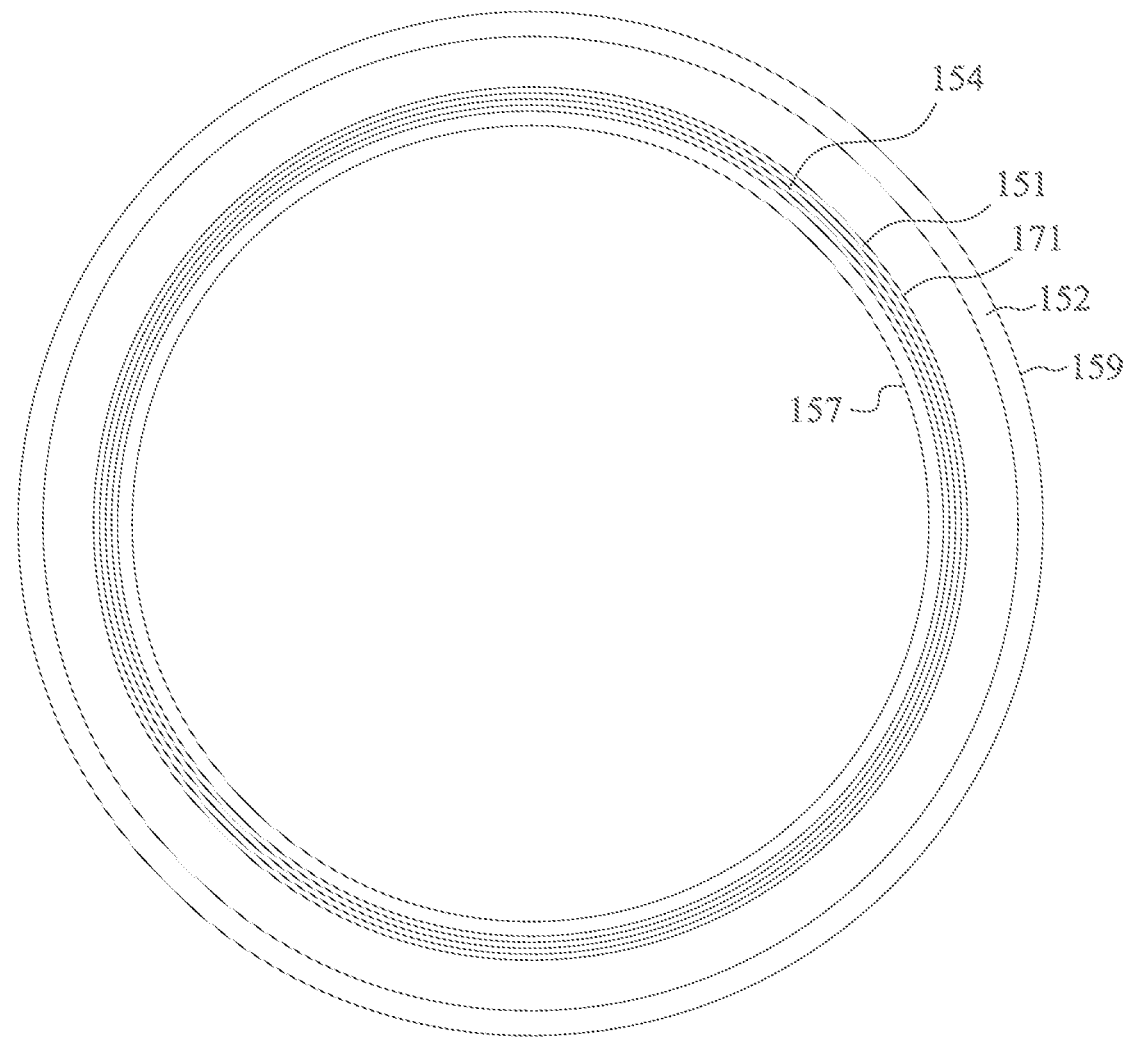
FIG. 3 illustrates a bottom surface of the cover ring shown in FIG. 1.

FIG. 3 illustrates a bottom surface of the cover ring 170 of FIG. 1. The cover ring 170 has an annular shape to match the annular deposition ring 180. However, the cover ring 170 can may have a different shape matching that of the deposition ring 180. The cover ring 170 includes a body having the annular shape and includes an inner circumferential end 157 and an outer circumferential surface 159. The cover ring 170 is fabricated from a suitable metal such as, titanium and stainless steel, or alternatively a suitable ceramic such as, aluminum oxide. The bottom surface of the cover ring 170 includes various features for accommodating the deposition ring 180.

Figure 4:
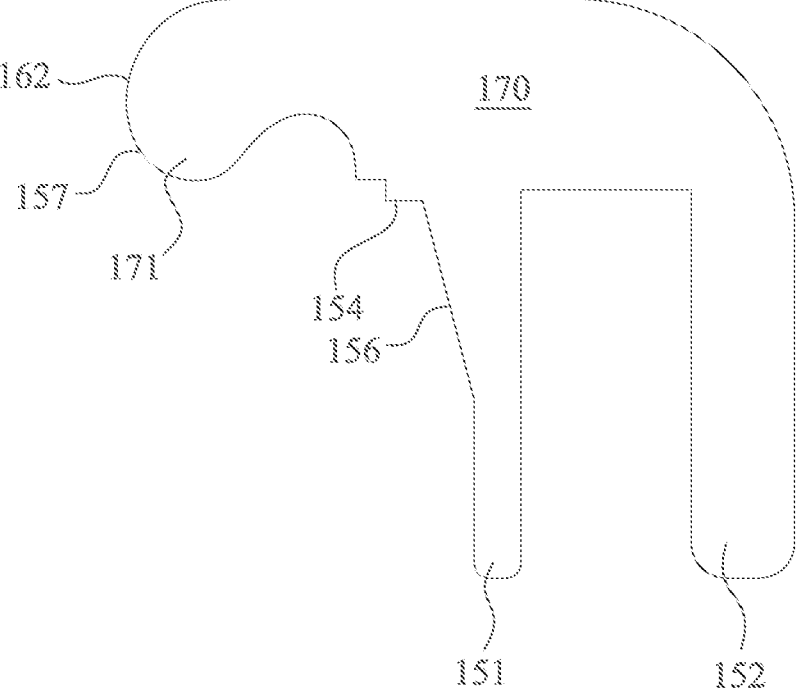
FIG. 4 illustrates a cross-sectional view of the cover ring in FIG. 3.

FIG. 4 illustrates a cross-sectional view of the cover ring 170 in FIG. 3. The cover ring 170 includes an inward ring 151 and outward ring 152. The rings 151, 152 extend downward in a spaced apart relation to define a slot to allow engagement with the end of a deposition shield of a processing chamber. The cover ring 170 further includes a seat 154 and tapered portion 156. The tapered portion 156 ensures correct alignment between the cover ring 170 and deposition ring 180. The cover ring 170 includes a lip 171 extending radially inward. The lip 171 includes an inside surface 162 that is rounded.

Figure 5:
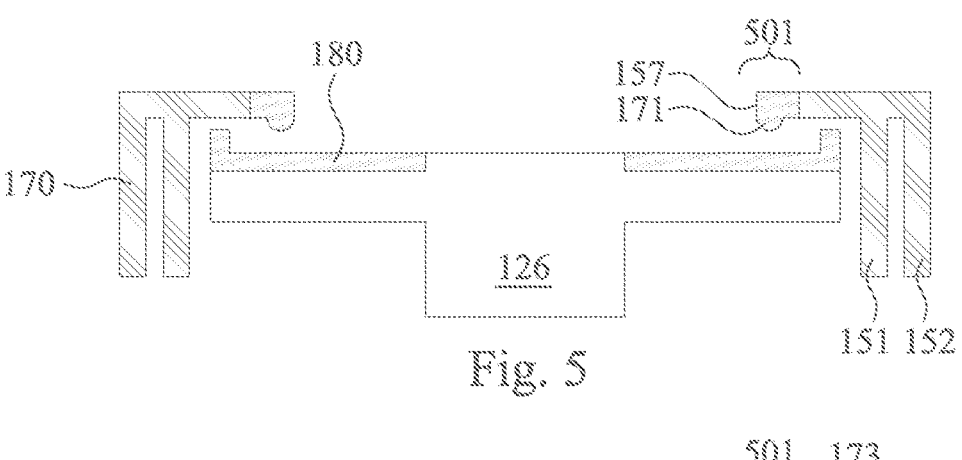
FIG. 5 illustrates an assembly including the cover ring positioned over the deposition ring.

FIG. 5 illustrates the cover ring 170 positioned over the deposition ring 180 and vertically separated therefrom. A portion 501 including the lip 171 of the cover ring 170 adjacent the inner circumferential end 157 has a rough, uneven finish, for example, having a surface roughness Ra of around 600-900 micro-inches or higher. The portion 501 is exposed to the deposition species and extends some distance radially outwards (e.g., towards the right in FIG. 5) from the inner circumferential end 157. Similarly, the deposition ring 180 has a rough, uneven finish. The uneven finish causes the deposition material (e.g., AlO) from the target to attach to the deposition ring 180 with relative ease. This causes the accumulation of the deposition material on the deposition ring 180. When the uneven surface of the cover ring 170 contacts the deposition material, the deposition material is dislodged or peeled off, and the particles are dispersed in the processing chamber.

Figure 6A:
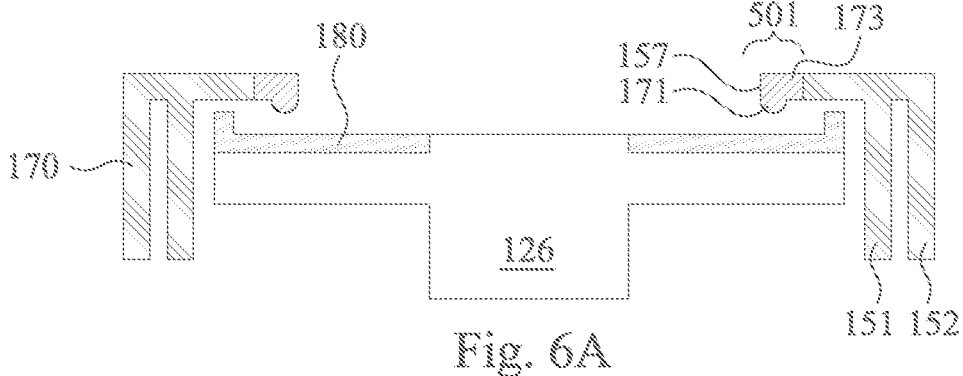
FIG. 6A illustrates an assembly including the cover ring including a coating layer and positioned over the deposition ring.
Figure 6B:
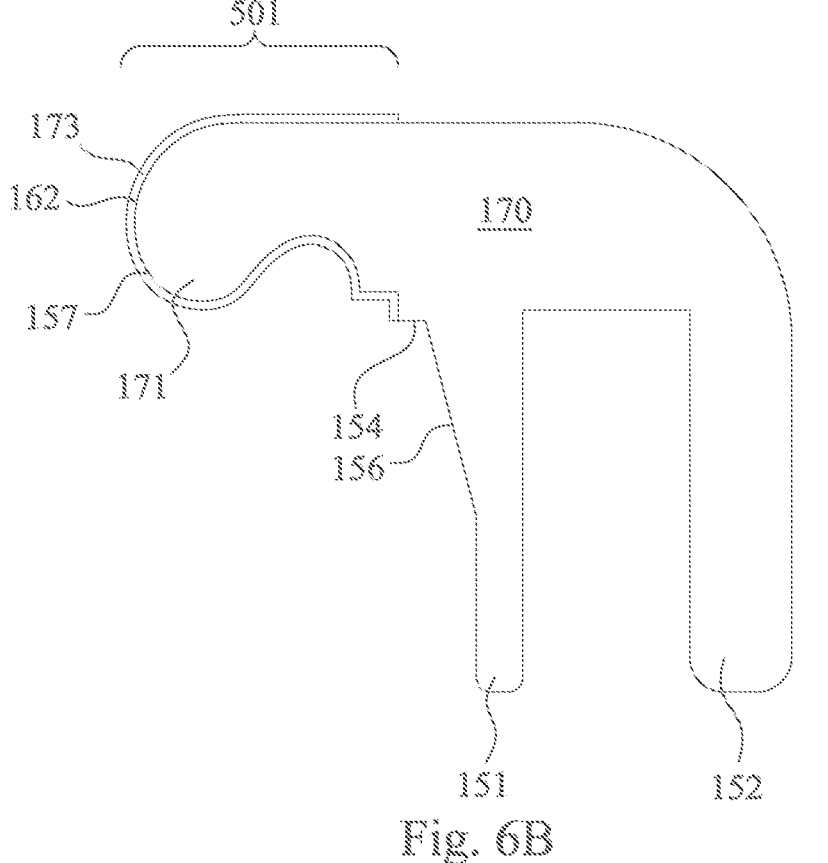
FIG. 6B illustrates a cross-sectional view of the cover ring in FIG. 6A.

FIG. 6A illustrates the cover ring 170 positioned over the deposition ring 180 and vertically separated therefrom. According to embodiments, the portion 501 of the cover ring 170 has a relatively smooth, even surface compared to the uneven, rough finish in FIG. 5. For the purposes of discussion herein, a surface having a surface roughness Ra of less than around 600 micro-inches is considered as a smooth, even surface. The smooth, even finish minimizes the dislodging or flaking of the deposition material that accumulates on the deposition ring 180. Referring to FIGS. 6A and 6B, a coating layer 173 is deposited on the entire portion 501 so that the portion 501 of the cover ring 170 has a relatively smooth, even surface.

Figure 6C:
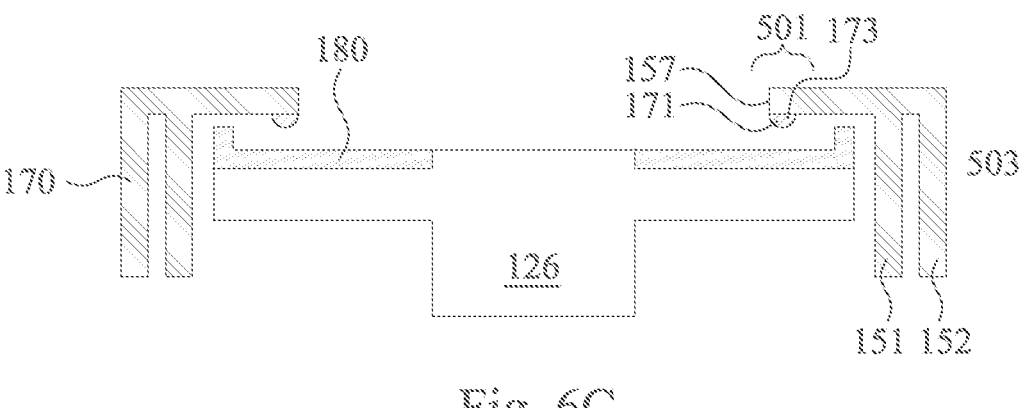
FIGS. 6C, 6D, 6E, 6F, and 6G illustrate different assemblies including the cover ring and/or the deposition ring including a coating layer.

In some other embodiments, as illustrated in FIG. 6C, only the lip 171 has the relatively smooth, even finish. The relatively smooth, even finish can be obtained by applying the coating layer 173.

Figure 6D:
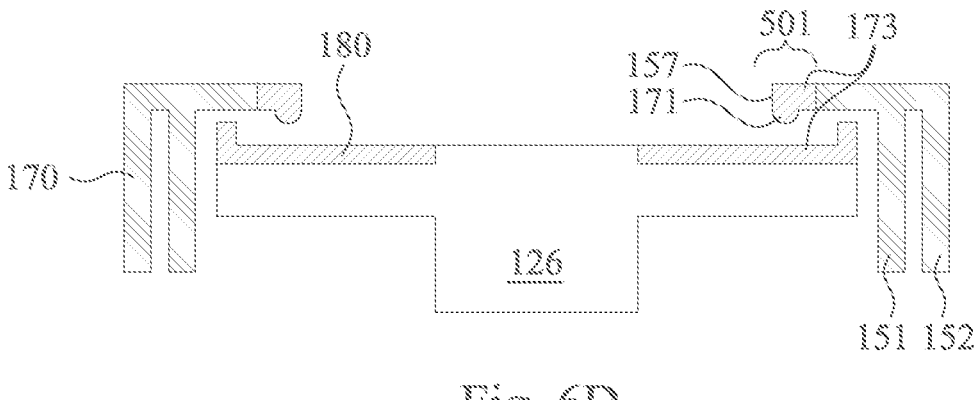
Figure 6E:
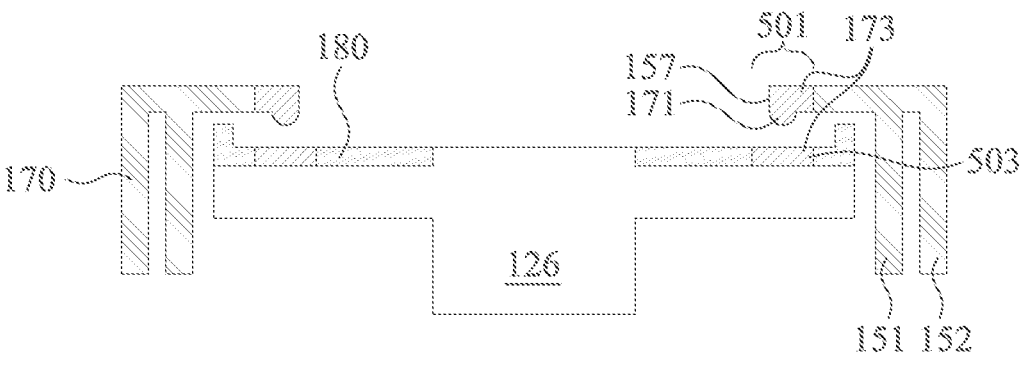
Figure 6F:
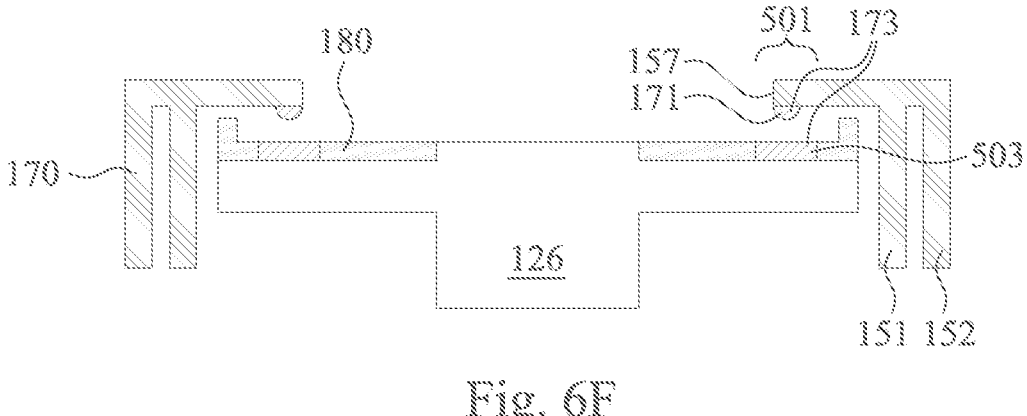

In other embodiments, as illustrated in FIG. 6D, the surface of the deposition ring 180 also has a relatively smooth, even finish in addition to the surface of the cover ring 170. In such embodiments, the coating layer 173 is applied to the deposition ring 180. In some embodiments, as illustrated in FIG. 6E, only a portion 503 of the deposition ring 180 directly underneath the portion 501 is applied with the coating layer 173. In some embodiments, and as illustrated in FIG. 6F, only portion 503 and only the lip 171 are applied with the coating layer 173.

Figure 6G:
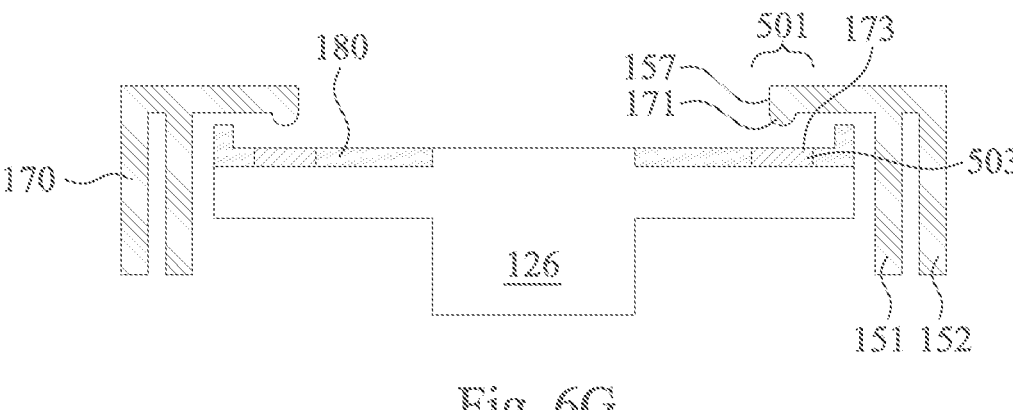

In some embodiments, and as illustrated in FIG. 6G, the surface of the deposition ring 180 has a relatively smooth, even finish instead of the portion 501 or the lip 171 of the cover ring 170. Referring to FIGS. 6A, 6D, and 6E, in some embodiments, the inward ring 151 and outward ring 152, and other portions of the cover ring 170 structure (excluding portion 501) have a surface roughness that is different than the roughness of the portion 501 including the coating layer 173. In some embodiments, the surface roughness is lower than the roughness of the portion 501 including the coating layer 173. In other embodiments, the surface roughness is higher than the roughness of the portion 501 including the coating layer 173. Similarly, referring to FIGS. 6C and 6F, in some other embodiments, the inward ring 151 and outward ring 152, and other portions of the cover ring 170 structure (excluding the lip 171) have a roughness that is different than the roughness of the lip 171 including the coating layer 173. In some embodiments, the surface roughness is lower than the roughness of the lip 171 including the coating layer 173. In other embodiments, the surface roughness is higher than the roughness of the lip 171 including the coating layer 173.

Figures 7A, 7B:
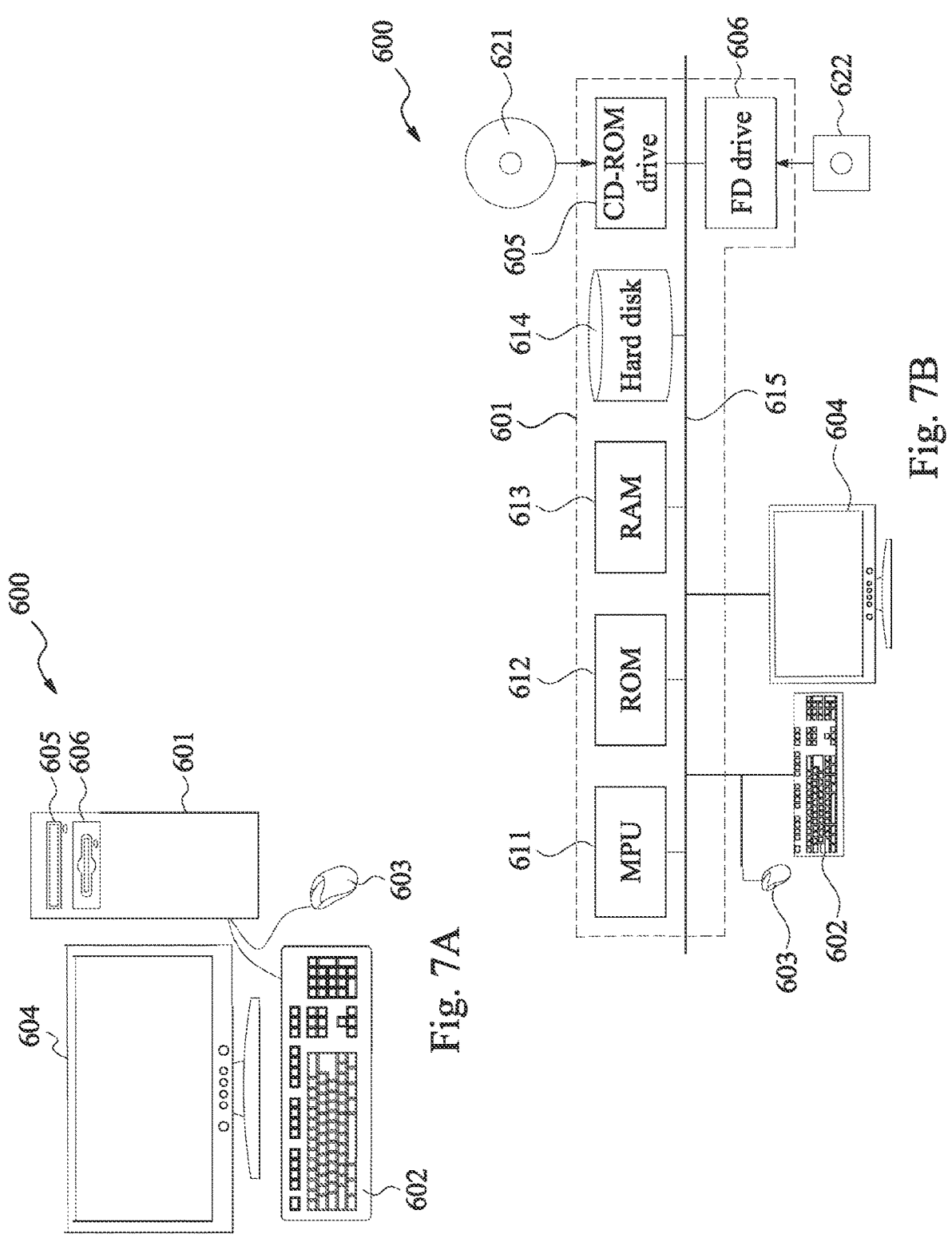
FIGS. 7A and 7B show a system controller according to embodiments of the disclosure.

FIG. 7A is a schematic view of a computer system that operates as a controller (e.g., system controller 190) for performing tasks relating to monitoring, execution and control of the movement and various process recipe tasks and recipe steps being performed in the processing chamber 100. The foregoing embodiments may be realized using computer hardware and computer programs executed thereon. In FIG. 7A, a computer system 600 is provided with a computer 601 including an optical disk read only memory (e.g., CD-ROM or DVD-ROM) drive 605 and a magnetic disk drive 606, a keyboard 602, a mouse 603, and a display 604.

FIG. 7B is a diagram showing an internal configuration of the computer system 600. In FIG. 7B, the computer 601 is provided with, in addition to the optical disk drive 605 and the magnetic disk drive 606, one or more processors 611, such as a micro processing unit (MPU), a ROM 612 in which a program such as a boot up program is stored, a random access memory (RAM) 613 that is connected to the MPU 611 and in which a command of an application program is temporarily stored and a temporary storage area is provided, a hard disk 614 in which an application program, a system program, and data are stored, and a bus 615 that connects the MPU 611, the ROM 612, and the like. Note that the computer 601 may include a network card (not shown) for providing a connection to a LAN.

The program code for causing the computer system 600 to execute the operations/tasks discussed in the foregoing embodiments may be stored in an optical disk 621 or a magnetic disk 622, which are inserted into the optical disk drive 605 or the magnetic disk drive 606, and be transmitted to the hard disk 614. Alternatively, the program may be transmitted via a network (not shown) to the computer 601 and stored in the hard disk 614. At the time of execution, the program is loaded into the RAM 613. The program may be loaded from the optical disk 621 or the magnetic disk 622, or directly from a network.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

Embodiments of the present disclosure are directed to limiting the removal or flaking (peeling) of the deposition material that has accumulated on the deposition ring, and thereby limiting the dispersion of the deposition material in the processing chamber. Thus, disruptions in the operations of the processing chamber are minimized.

It will be understood that not all advantages have been necessarily discussed herein, no particular advantage is required for all embodiments or examples, and other embodiments or examples may offer different advantages.

According to one aspect of the present disclosure, an assembly includes a cover ring having a first surface and a second surface opposite the first surface, the first surface of the cover ring having a first roughness, and a deposition ring having a first surface facing the cover ring and a second surface opposite the first surface, the first surface of the deposition ring having a second roughness, wherein the first roughness is different from the second roughness. In some embodiments, the first roughness is less than the second roughness. In some embodiments, the first roughness is greater than the second roughness. In some embodiments, the first surface of the deposition ring is directly below the first surface of the cover ring. In some embodiments, the cover ring includes a metallic material. In some embodiments, the deposition ring includes a ceramic material. In some embodiments, the cover ring includes a lip extending from the first surface, and wherein the lip has the first roughness. In some embodiments, wherein the cover ring includes a first portion that includes the first surface having the first roughness, and wherein portions of the cover ring other than the first portion have a third roughness that is different than the first roughness. In some embodiments, the cover ring is coated with a metallic material and the metallic material has the first roughness.

According to another aspect of the present disclosure, a processing chamber includes a target having a first surface and a second surface that is opposite the first surface, an RF power supply coupled to the target, a DC power supply coupled to the target, a magnetron disposed adjacent to the second surface of the target, a substrate support having a substrate receiving surface for securing a substrate for processing, a ground shield, a cover ring positioned on the ground shield, and a deposition ring disposed on the substrate support, the deposition ring having a first surface facing the cover ring and a second surface opposite the first surface. In some embodiments, the cover ring includes a first surface facing the substrate support and a second surface opposite the first surface. In some embodiments, a roughness of at least a portion of the first surface of the cover ring is less than a roughness of at least a portion of the first surface of the deposition ring. In some embodiments, the portion of the first surface of the cover ring is directly above the portion of the first surface of the deposition ring. In some embodiments, the cover ring includes a metallic material. In some embodiments, the deposition ring includes a ceramic material.

According to an aspect of the present disclosure, a substrate processing method includes introducing gas into a processing chamber. The processing chamber includes a target having a first surface and a second surface that is opposite the first surface, an RF power supply coupled to the target, a DC power supply coupled to the target, a substrate support having a substrate receiving surface for securing a substrate for processing, a ground shield, a cover ring positioned on the ground shield, and a deposition ring disposed on the substrate support, the deposition ring having a first surface facing the cover ring and a second surface opposite the first surface. The cover ring includes a first surface facing the substrate support and a second surface opposite the first surface and the first surface of the cover ring has a first roughness, and the first surface of the deposition ring of has a second roughness, and the first roughness is less than the second roughness. The method further includes lowering the substrate support, loading the substrate onto the substrate support, raising the substrate support, forming plasma in the processing chamber, sputtering material from the target by colliding ions in the plasma with the target, and depositing target material on the substrate. In some embodiments, the cover ring includes a lip on the first surface thereof and only the lip has the first roughness. In some embodiments, portions of the cover ring other than the lip have a third roughness that is different than the first roughness. In some embodiments, the method further includes sputtering material from the target to form a layer of aluminum oxide on the substrate. In some embodiments, the first roughness of the cover ring is obtained by applying a coating layer having the first roughness on the cover ring. In some embodiments, the first roughness of the cover ring limits dislodging of deposition material that is deposited on the deposition ring. In some embodiments, the second roughness of the deposition ring limits deposition of deposition material on the deposition ring.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An assembly, comprising:
a cover ring having a first surface and a second surface opposite the first surface, wherein the cover ring includes an annular shape including an inner circumferential end and an outer circumferential surface, the first surface of the cover ring includes a lip at a position proximal to the inner circumferential end, only the lip of the first surface of the cover ring is covered with a first coating having a first roughness, and the first roughness has a Ra of less than 600 micro-inches; and
a deposition ring having a first surface facing the cover ring and a second surface opposite the first surface, wherein the first surface of the deposition ring has a second roughness, the first roughness of the first coating on the lip of the first surface of the cover ring is less than the second roughness of the first surface of the deposition ring, the lip of the first surface of the cover ring has a convex shape protruding toward the first surface of the deposition ring, and portions of the cover ring other than the first coating on the lip have a third roughness that is greater than the first roughness of the first coating on the lip.

2. The assembly of claim 1, wherein the first surface of the deposition ring is directly below the lip on the first surface of the cover ring.

3. The assembly of claim 1, wherein the cover ring includes a metallic material.

4. The assembly of claim 1, wherein the deposition ring includes a ceramic material.

5. The assembly of claim 1, wherein the first coating comprises a metallic material.

6. A processing chamber, comprising:
a target having a first surface and a second surface that is opposite the first surface;
an RF power supply coupled to the target;
a DC power supply coupled to the target;
a magnetron disposed adjacent to the second surface of the target;
a substrate support having a substrate receiving surface for securing a substrate for processing;
a ground shield;
a cover ring positioned on the ground shield, wherein the cover ring includes a first surface facing the substrate support, a second surface opposite the first surface, an annular shape including an inner circumferential end and an outer circumferential surface, and the first surface of the cover ring includes a lip at a position proximal to the inner circumferential end; and
a deposition ring disposed on the substrate support, the deposition ring having a first surface facing the cover ring and a second surface opposite the first surface,
wherein the lip of the first surface of the cover ring has a convex shape protruding toward the first surface of the deposition ring, only the lip of the first surface of the cover ring is covered with a first coating having a first roughness, the first roughness of the first coating on the lip has a Ra of less than 600 micro-inches, the first roughness of the first coating on the lip is less than a second roughness of at least a portion of the first surface of the deposition ring, and portions of the cover ring other than the first coating on the lip have a third roughness that is higher than the first roughness of the first coating on the lip.

7. The processing chamber of claim 6, wherein the lip of the cover ring is directly above the portion of the first surface of the deposition ring.

8. The processing chamber of claim 6, wherein the cover ring includes a metallic material.

9. The processing chamber of claim 6, wherein the deposition ring includes a ceramic material.

10. A processing chamber, comprising:
a target having a first surface and a second surface that is opposite the first surface,
an RF power supply coupled to the target,
a DC power supply coupled to the target,
a substrate support having a substrate receiving surface for securing a substrate for processing,
a ground shield,
a cover ring positioned on the ground shield, wherein the cover ring includes a first surface facing the substrate support and a second surface opposite the first surface, the cover ring includes an annular shape including an inner circumferential end and an outer circumferential surface, the first surface of the cover ring includes a lip at a position proximal to the inner circumferential end, and
a deposition ring disposed on the substrate support, the deposition ring having a first surface facing the cover ring and a second surface opposite the first surface,
wherein the lip of the first surface of the cover ring has a convex shape protruding toward the first surface of the deposition ring,
only the lip of the first surface of the cover ring is covered with a first coating having a first roughness, the first roughness has a Ra of less than 600 micro-inches,
a portion of the first surface of the deposition ring directly opposite the lip has a second roughness, and the first roughness of the first coating on the lip of the cover ring is less than the second roughness on the first surface of the deposition ring, and portions of the cover ring other than the first coating on the lip have a third roughness that is greater than the first roughness of the first coating on the lip.

11. The processing chamber of claim 10, wherein a remainder of the cover ring other than the first coating on the lip has the third roughness.

12. The processing chamber of claim 10, wherein the portion of the first surface of the deposition ring comprises a second coating having the second roughness.

13. The processing chamber of claim 10, wherein the second roughness has a Ra ranging from 600 micro-inches to 900 micro-inches.

14. The assembly of claim 1, wherein the second roughness has a Ra ranging from 600 micro-inches to 900 micro-inches.

15. The processing chamber of claim 6, wherein the second roughness has a Ra ranging from 600 micro-inches to 900 micro-inches.

16. The processing chamber of claim 12, wherein only the portion of the first surface of the deposition ring directly opposite the lip comprises the second coating.

17. The assembly of claim 1, wherein a remainder of the cover ring other than the first coating on the lip has the third roughness.

18. The processing chamber of claim 6, wherein a remainder of the cover ring other than the first coating on the lip has the third roughness.

19. The assembly of claim 1, wherein the first surface of the deposition ring comprises a second coating having the second roughness.

20. The processing chamber of claim 6, wherein the first surface of the deposition ring comprises a second coating having the second roughness.

* * * * *